(12) United States Patent
Lee

(10) Patent No.: US 6,396,766 B1
(45) Date of Patent: May 28, 2002

(54) SEMICONDUCTOR MEMORY ARCHITECTURE FOR MINIMIZING INPUT/OUTPUT DATA PATHS

(75) Inventor: Jae-woong Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/829,650

(22) Filed: Apr. 10, 2001

(30) Foreign Application Priority Data

Oct. 25, 2000 (KR) .......................................... 2000-62876

(51) Int. Cl.$^7$ ................................................ G11C 8/00
(52) U.S. Cl. ................. 365/230.03; 365/63; 365/189.02
(58) Field of Search ...................... 365/51, 63, 230.03, 365/230.02, 189.02

(56) References Cited

U.S. PATENT DOCUMENTS

| | | | | |
|---|---|---|---|---|
| 5,838,627 A | * | 11/1998 | Tomishima et al. | 365/230.03 |
| 6,072,744 A | * | 6/2000 | Kwean | 365/230.03 |
| 6,091,620 A | * | 7/2000 | Kablanian | 365/63 |
| 6,163,475 A | * | 12/2000 | Proebsting | 365/63 |

FOREIGN PATENT DOCUMENTS

JP          10241363          11/1998

OTHER PUBLICATIONS

Matsumiya Et Al., A 15–ns 16–Mb SRAM with Interdigitated Bit–Line Architecture, IEEE Journal of Solid–State Circuits, vol. 27, No. 11, Nov. 1992, pp. 1497–1503.*

* cited by examiner

Primary Examiner—Son Mai
(74) Attorney, Agent, or Firm—F.Chau&Associates, LLP

(57) ABSTRACT

A semiconductor memory device comprising an architecture for minimizing the lengths of the I/O (input/output) data paths and the difference in length between the data paths. In one aspect, a semiconductor memory device comprises first and second pad groups, first, second, third and fourth banks and first and second circuits. The first pad group comprises a portion of the total number of pads and is located in proximity to the center of the chip, and the second pad group comprises the remaining pads. The first, second, third and fourth banks include first and second, third and fourth, fifth and sixth and seventh and eighth blocks having memory cells, respectively, and further include first and second, third and fourth, fifth and sixth and seventh and eighth I/O units for inputting and outputting the data in the first through fourth blocks, respectively. The first circuit is connected between the first pad group and the odd-numbered I/O units of the banks, and performs multiplexing. The second circuit is connected between the second pad group and the even-numbered I/O units of the banks, and performs multiplexing. The banks and circuits are disposed on the semiconductor device such that the data buses connecting the corresponding banks and circuits are substantially the same length and width. Each of the first and second circuits can be replaced with a plurality of I/O sense amplifiers, and the I/O units can be replaced with I/O multiplexers.

21 Claims, 4 Drawing Sheets

FIG. 1
(Prior Art)

| Pin | Signal | | Pin | Signal |
|---|---|---|---|---|
| 1 | V<sub>DD</sub> | | 54 | Vss |
| 2 | DQ0 | | 53 | DQ15 |
| 3 | V<sub>DD</sub>Q | | 52 | VssQ |
| 4 | DQ1 | | 51 | DQ14 |
| 5 | DQ2 | | 50 | DQ13 |
| 6 | VssQ | | 49 | V<sub>DD</sub>Q |
| 7 | DQ3 | | 48 | DQ12 |
| 8 | DQ4 | | 47 | DQ11 |
| 9 | V<sub>DD</sub>Q | | 46 | VssQ |
| 10 | DQ5 | | 45 | DQ10 |
| 11 | DQ6 | | 44 | DQ9 |
| 12 | VssQ | | 43 | V<sub>DD</sub>Q |
| 13 | DQ7 | | 42 | DQ8 |
| 14 | V<sub>DD</sub> | | 41 | Vss |
| 15 | LDQM | | 40 | NC/RFU |
| 16 | $\overline{WE}$ | | 39 | UDQM |
| 17 | $\overline{CAS}$ | | 38 | CLK |
| 18 | $\overline{RAS}$ | | 37 | CKE |
| 19 | $\overline{CS}$ | | 36 | N.C. |
| 20 | BA0 | | 35 | A11 |
| 21 | BA1 | | 34 | A9 |
| 22 | A10/A9 | | 33 | A8 |
| 23 | A0 | | 32 | A7 |
| 24 | A1 | | 31 | A6 |
| 25 | A2 | | 30 | A5 |
| 26 | A3 | | 29 | A4 |
| 27 | V<sub>DD</sub> | | 28 | Vss |

SEMICONDUCTOR MEMORY ARCHITECTURE FOR MINIMIZING INPUT/OUTPUT DATA PATHS

BACKGROUND

1. Technical Field

The present invention relates generally to high-speed memory devices and, in particular, to semiconductor memory architectures that minimize I/O (input/output) data paths and differences between the I/O data paths.

2. Description of the Related Art

In general, a synchronous dynamic random access memory (SDRAM) receives and outputs data in synchronization with a strobe signal and a system clock signal. A SDRAM typically comprises at least two banks and a plurality of peripheral circuits for the memory cells that are installed in symmetry to each other with respect to all banks.

FIG. 1 is a diagram illustrating a pin configuration of a conventional SDRAM chip. Further, FIG. 2 is a block diagram illustrating an architecture of the SDRAM having the pin configuration shown in FIG. 1. The pin layout of FIG. 1, which is defined by the JEDEC (Joint Electron Device Engineering Council) standard, illustrates the pin layout for pins corresponding to addresses A0 through A11, commands such as CAS (column address strobe), RAS (row address strobe), and data pins DQ0 through DQ15.

In FIG. 2, the SDRAM architecture comprises four banks A through D, which are located adjacent to each other, and a DB/MUX 1, which serves as both a data buffer and a multiplexer, located between banks A and B and banks C and D. The DB/MUX 1 operatively connects the four banks A, B, C, D to each other and operatively connects data paths DQ0 through DQ15 to each other.

Each of the four banks A, B, C and D comprise a pair of blocks A1–A2, B1–B2, C1–C2 and D1–D2. Each of the blocks comprises a number of I/O sense amplifiers (IOSAs) that is equal to the number of output data. As is known in the art, the sense amplifiers are used for sensing and amplifying the state of data.

In the four banks A, B, C, D, the odd-numbered blocks A1, B1, C1, D1 each comprise a plurality of cells representing 8-bit data of DQ0 through DQ7 among 16-bit data of DQ0 through DQ15. Further, the even-numbered blocks A2, B2, C2, D2 each comprise a plurality of cells representing 8-bit data of DQ8 through DQ15 among the 16-bit data of DQ0 through DQ15.

A plurality of pads DQ0 through DQ15 connected to the DB/MUX 1 comprise two groups of pads—a first group which inputs/outputs a total of 8 bits DQ4 through DQ11, and a second group which inputs/outputs a total of 8 bits DQ0 through DQ3 and DQ12 through DQ15.

During operation of the SDRAM (of FIGS. 1 and 2), signals from the address pads and command pads that are located on one side of the chip must be propagated to corresponding memory cells after passing through the center of a chip, and the data output from the memory cells must be propagated to the data paths located at the other side of the chip. As SDRAM chips are enlarged, the overall performance of a circuit depends not only on the size and performance of a single transistor, but also on the time for propagating signals along the wiring of the circuit. Thus, a circuit comprising long data transmission paths can degrade the overall performance of an SDRAM. For instance, as shown in FIG. 2, a long data path (indicated by bold arrows) can significantly prolong the time for propagating a specific signal. Further, the difference between the long data path and a short data path (indicated by a dotted arrow) can be significant.

Accordingly, a semiconductor architecture that provides a reduction in the length of the data paths in a SDRAM is highly desirable. Although this reduction may be accomplished by changing the pin configuration of a memory integrated circuit, this is not preferable since modifications to the pin configuration of standard memory integrated circuits would render such chips incompatible with existing systems.

SUMMARY OF THE INVENTION

The present invention is directed to semiconductor memory devices having an architecture that minimize the I/O data paths and the differences between such data paths. In one aspect of the present invention, a semiconductor memory device comprises:

- a plurality of pad groups each comprising a plurality of data I/O (input/output) pads;
- a plurality of banks, wherein each bank comprises a plurality of blocks of memory cells and a plurality of I/O units for sensing and amplifying the state of data output from the memory cells; and
- a plurality of circuits connected between the plurality of banks and the plurality of pad groups for performing multiplexing.

In another aspect, the pad groups comprise a first pad group and a second pad group. The first pad group is preferably located in proximity to the center of the semiconductor device, and comprises a first portion of a total number of data I/O pads. The second pad group comprises a second portion of the total number of data I/O pads. Preferably, the first and second pad groups comprise an equal number of pads.

In yet another aspect, the plurality of banks comprise a first, second, third and fourth bank. The first bank comprises a first block of memory cells, a second block of memory cells, a first I/O unit comprising a plurality of sense amplifiers, and a second I/O unit comprising a plurality of sense amplifiers. The second bank comprises a third block of memory cells, a fourth block of memory cells, a third I/O unit comprising a plurality of sense amplifiers and a fourth I/O unit comprising a plurality of sense amplifiers. The second bank is preferably located adjacent to the first bank on the semiconductor memory device. The third bank comprises a fifth block of memory cells, a sixth block of memory cells, a fifth I/O unit comprising a plurality of sense amplifiers, and a sixth I/O unit comprising a plurality of sense amplifiers. The third bank is preferably located opposite to the first bank on the semiconductor memory device. The fourth bank comprises a seventh block of memory cells, an eighth block of memory cells, a seventh I/O unit comprising a plurality of sense amplifiers and an eighth I/O unit comprising a plurality of sense amplifiers. The fourth bank is preferably located opposite to the second bank on the semiconductor memory device.

In another aspect, the circuits comprise a first and second circuit. The first circuit comprises a plurality of multiplexers, and is operatively connected to the first pad group and to the first, third, fifth and seventh I/O units, respectively, via a first data bus, a third data bus, a fifth data bus and a seventh data bus. The second circuit comprises a plurality of multiplexers, and is operatively connected to the second pad group and to the second, fourth, sixth and eighth I/O units, respectively, via a second data bus, a fourth data bus, a sixth data bus and an eighth data bus.

Preferably, the banks and circuits are disposed on the semiconductor device such that all of the data paths between the banks and the circuits are substantially the same length. Further, the data paths are preferably substantially the same width. Further, the data buses connecting the pad groups and circuits are preferably substantially the same length and width.

In another aspect of the invention, each of the I/O units comprise a plurality of multiplexers and each of the circuits comprise a plurality of sense amplifiers.

These and other aspects, features, and advantages of the present invention will become apparent from the following detailed description of the preferred embodiments, which is to be read in connection with the accompanying drawings.

BRIEF DESCRIPTION OF THE DRAWINGS

FIG. 1 is a diagram illustrating a pin configuration of a standard synchronous dynamic random access memory (SDRAM);

DETAILED DESCRIPTION OF PREFERRED EMBODIMENTS

Figure 3:
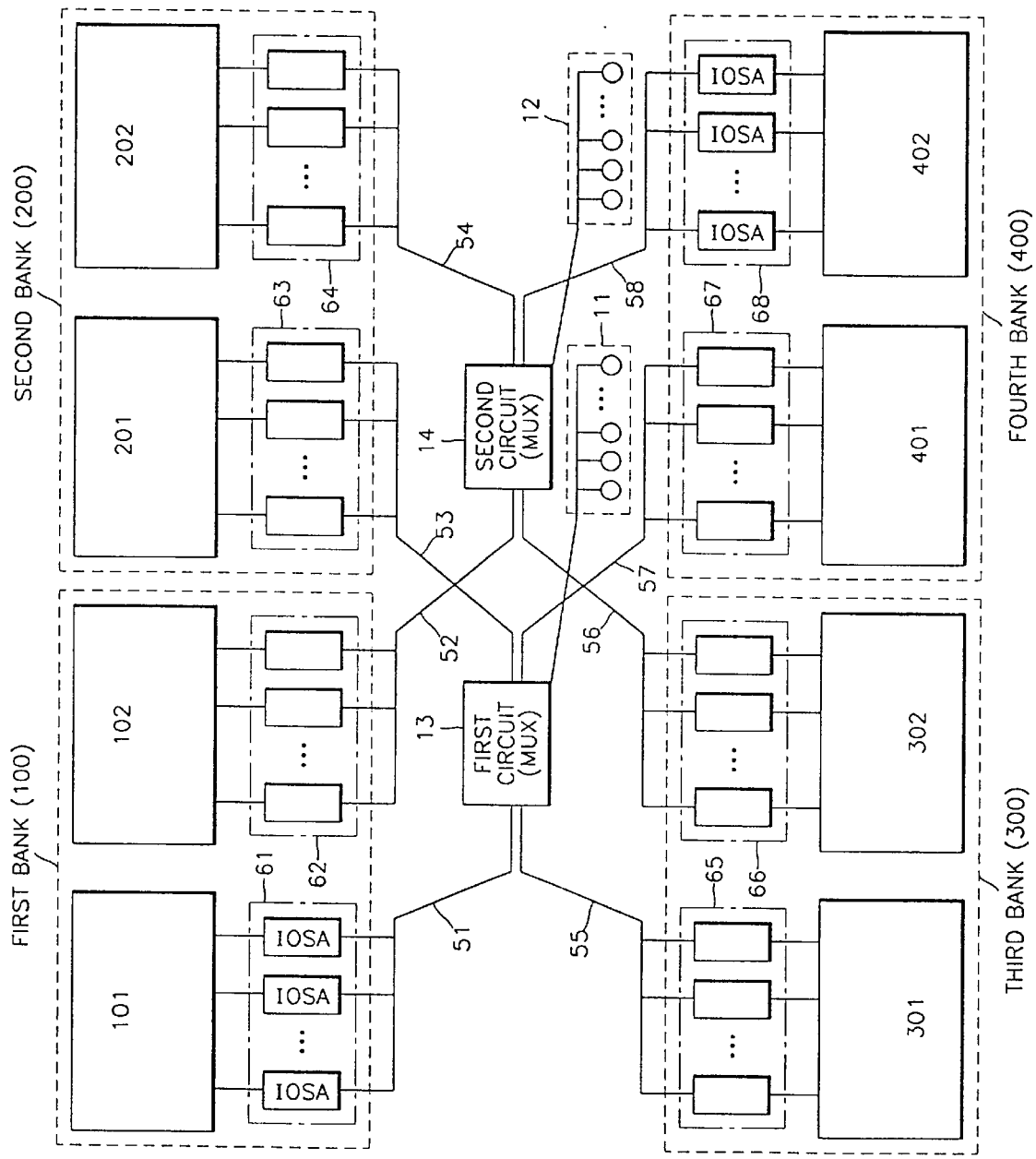
FIG. 3 is a block diagram of an SDRAM architecture according to a first embodiment of the present invention.

FIG. 3 is a block diagram of an SDRAM architecture according to an embodiment of the present invention for minimizing the I/O data paths while maintaining the JEDEC standard pin configuration shown in FIG. 1. The SDRAM comprises a first pad group 11, a second pad group 12, a first bank 100, a second bank 200, a third bank 300, a fourth bank 400, a first (MUX) circuit 13 and a second (MUX) circuit 14. The first pad group 11, which is located in proximity to the center of the chip, comprises a portion of a total number of I/O data pads. The second pad group 12 comprises the remaining I/O data pads.

The first bank 100 comprises a first block 101 of memory cells, a first I/O unit 61 having a plurality of I/O sense amplifiers (IOSA) for sensing and amplifying the data in the first block 101, a second block 102 of memory cells, and a second I/O unit 62 having a plurality of I/O sense amplifiers IOSA for sensing and amplifying the data in the second block 102.

The second bank 200 comprises a third block 201 of memory cells, a third I/O unit 63 having a plurality of I/O sense amplifiers IOSA for sensing and amplifying the data in the third block 201, a fourth block 202 of memory cells, and a fourth I/O unit 64 having a plurality of I/O sense amplifiers IOSA for sensing and amplifying the data in the fourth block 202. The second bank 200 is adjacent to the first bank 100.

The third bank 300 comprises a fifth block 301 of memory cells, a fifth I/O unit 65 having a plurality of I/O sense amplifiers IOSA for sensing and amplifying the data in the fifth block 301, a sixth block 302 of memory cells, and a sixth I/O unit 66 having a plurality of I/O sense amplifiers IOSA for sensing and amplifying the data in the sixth block 302. The third bank 300 is opposite to the first bank 100.

The fourth bank 400 comprises a seventh block 401 of memory cells, a seventh I/O unit 67 having a plurality of I/O sense amplifiers IOSA for sensing and amplifying the data in the seventh block 401, an eighth block 402 of memory cells, and an eighth I/O unit 68 having a plurality of I/O sense amplifiers IOSA for sensing and amplifying the data in the eighth block 402. The fourth bank 400 is opposite to the second bank 200.

The first circuit 13 is operatively connected to the first, third, fifth and seventh I/O units 61, 63, 65 and 67 (the odd-numbered I/O units) via a first data bus 51, a third data bus 53, a fifth data bus 55 and a seventh data bus 57, respectively. The first circuit 13 is also operatively connected to the first pad group 11. The first circuit 13 multiplexes data that is input and output between banks 100 through 400 and the pads of the first pad group 11.

The second circuit 14 is operatively connected to the second, fourth, sixth and eighth I/O units 62, 64, 66 and 68 (the even-numbered I/O units) via a second data bus 52, a fourth data bus 54, a sixth data bus 56 and an eight data bus 58, respectively. The second circuit 14 is also operatively connected to the second pad group 12. The second circuit 14 multiplexes the data that is input and output between the banks 100 through 400 and the pads of the second pad group 12.

Figure 4:
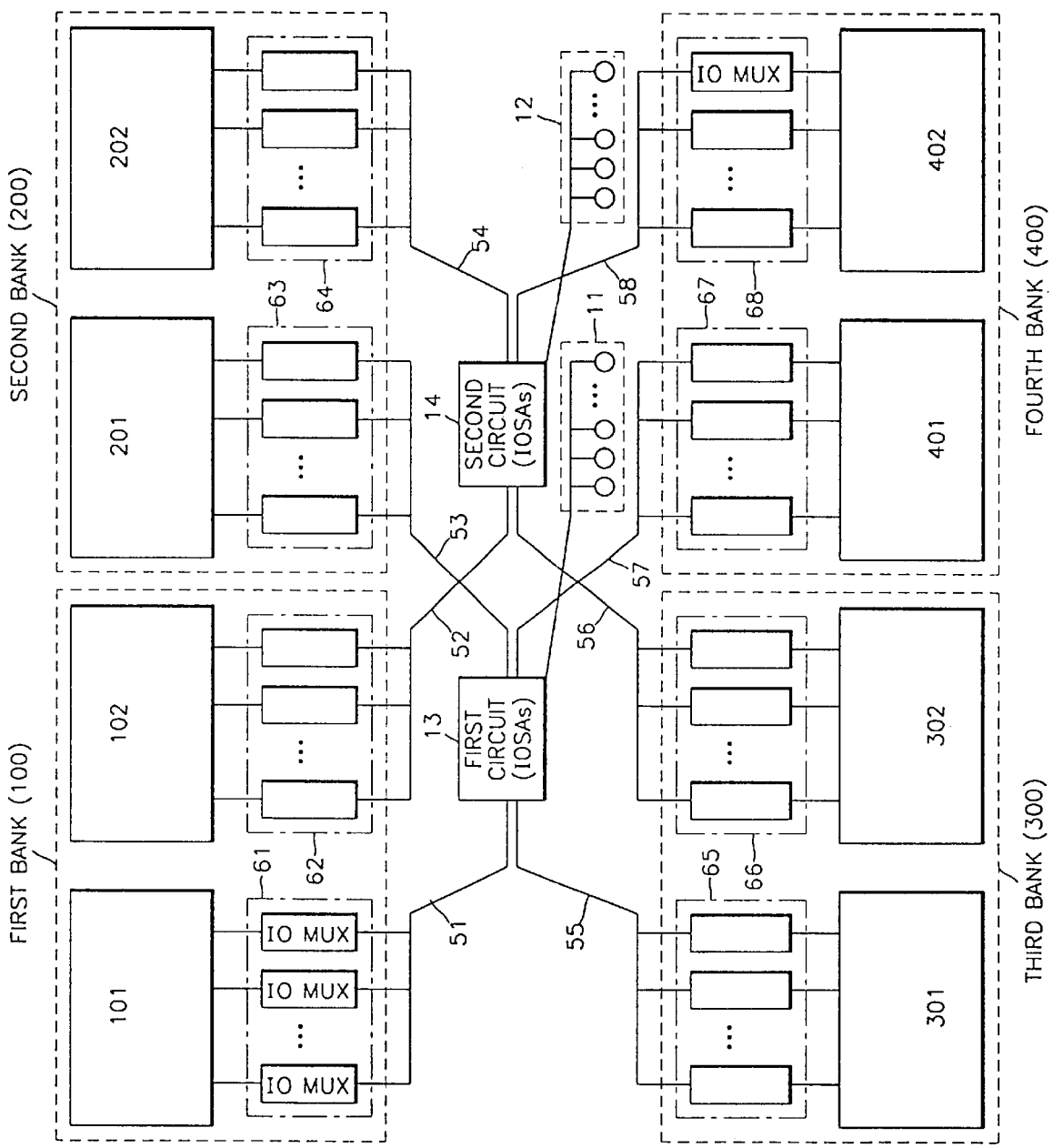
FIG. 4 is a block diagram of an SDRAM architecture according to a second embodiment of the present invention.

FIG. 4 is a block diagram of an SDRAM architecture according to another embodiment of the present invention for minimizing the I/O data paths while maintaining the JEDEC standard pin configuration shown in FIG. 1. A semiconductor memory device according this embodiment is similar to the above embodiment of FIG. 3 except that the first and second circuits 13 and 14 comprise I/O sense amplifiers (rather than multiplexers as in FIG. 3). The number of I/O sense amplifiers in the first and second circuits 13, 14, preferably corresponds to the number of input/output data paths to the respective data banks. Another difference is that the I/O units 61–68 each comprises a plurality of I/O multiplexers IOMUX (rather that I/O sense amplifiers IOSAs as in FIG. 3), which are operatively connected between corresponding one of the blocks 101, 102, 201, 202, 301, 302, 401 and 402 and the first and second circuits 13 and 14.

The I/O sense amplifiers IOSAs comprising the first and second circuits 13 and 14 sense and amplify data input and output between the I/O units 61–68 and the corresponding pad groups 11, 12. The I/O multiplexers IOMUX comprising the I/O units 61–68 transmit data received from corresponding pad groups 11,12 via the corresponding circuits 13,14 to corresponding memory cells, as well as transmit data in memory cells of corresponding blocks 101–402 to the corresponding first and second circuits 13, 14.

For each of the above-described embodiments, the first block 101 and the second block 102 of the first bank 100 preferably input and output an equal number of data. Likewise, the third and fourth blocks 201, 202 of the second bank 200, the fifth and sixth blocks 301, 302 of the third bank 300 and the seventh and eighth blocks 401, 402 of the fourth bank 400, preferably input and output an equal number of data. For example, if each of the odd-numbered blocks 101, 201, 301, 401 input/output data in 8 bits, then each of the even-numbered blocks 102, 202, 302, 402 preferably input/output data in 8 bits.

Further, the weights of the data bits of the odd-numbered blocks 101, 201, 301 and 401 are preferably the same, and the weights of the data bits of the even-numbered blocks 102, 202, 302 and 402 are preferably the same. For example, assuming that the architecture supports a total of 16 bits D0 through D15, if each of the odd-numbered blocks 101, 201, 301 and 401 comprise a total of 8 data bits D4 through D11, each of the even-numbered blocks 102, 202, 302 and 402 comprise a total of 8 data bits D0 through D3 and D12 through D15.

Moreover, the odd-numbered blocks 101, 201, 301 and 401 are located, two-dimensionally, at the same position on the banks 100 through 400, and likewise for the even-numbered blocks 102, 202, 302 and 402. For example, as illustrated in FIGS. 3 and 4, each of the odd-numbered blocks 101, 201, 301 and 401 are located on the left of the banks 100 through 400, and each of the even-numbered blocks 102, 202, 302 and 402 are located on the right of the banks 100 through 400.

Data is input to or output from the banks 100, 200, 300 and 400 via the corresponding I/O units 61–68. In the embodiment shown in FIG. 3, each of the I/O units 61–68 have an equal number of I/O sense amplifiers IOSAs and I/O data. In the embodiment shown in FIG. 4, each of the I/O units 61–68 have an equal number of I/O multiplexers IOMUX and I/O data.

Preferably, in the above-described embodiments, the first circuit 13 is disposed such that the odd-numbered data buses 51, 53, 55 and 57 have substantially the same data propagation length. In addition, the second circuit 14 is preferably disposed such that the even-numbered data buses 52, 54, 56 and 58 have substantially the same data propagation length. Furthermore, the first and second circuits 13 and 14 are disposed such that all the data busses 51–58 have substantially the same data propagation length.

The first circuit 13 is connected to the first pad group 11 by a number of metal lines equal to the number of pads comprising the first pad group 11. The second circuit 14 is connected to the second pad group 12 by a number of metal lines equal to the number of pads comprising the second pad group 12. For example, if the number of pads is 8, the number of metal lines is 8. Preferably, the data propagation length of all the metal lines are substantially the same.

Each of the data buses 51–58 comprise a number of bus lines equal to the number of I/O sense amplifiers IOSAs. For example, if the number of I/O sense amplifiers IOSAs is 8, the first data bus 51 has 8 bus lines. Preferably, when a semiconductor memory device according to the present invention is formed on a wafer, the data buses 51–58 have substantially the same length and width.

In the embodiment of FIG. 3, when data is read from the semiconductor memory device, the data stored in the memory cells (that are addressed by an address signal) passes through the I/O sense amplifiers IOSAs and the data buses 51–58. The data stored in the odd-numbered blocks 101, 201, 301 and 401 passes through the first circuit 13 and then is transmitted to the pads comprising the first pad group 11. The data stored in the even-numbered blocks 102, 202, 302 and 402 passes through the second circuit 14 and is then transmitted to the pads comprising the second pad group 12.

In the embodiment of FIG. 4, when data is read from the semiconductor memory device, the data stored in the memory cells (that are addressed by an address signal) passes through the I/O multiplexers IOMUXes and the data buses 51–58. The data stored in the odd-numbered blocks 101, 201, 301 and 401 passes through the first circuit 13 and is then transmitted to the pads comprising the first pad group 11. The data stored in the even-numbered blocks 102, 202, 302 and 402 passes through the second circuit 14 and is then transmitted to the pads comprising the second pad group 12.

In the embodiment of FIG. 3, when data is written to the semiconductor memory device, the data that is input to the pads of the first and second pad groups 11 and 12 is transmitted to the first and second circuits 13 and 14, respectively. Next, the data passes through the data buses 51–58 and the I/O sense amplifiers IOSAs, and then is written to the memory cells of the blocks 101, 102, 201, 202, 301, 302, 401 and 402 in response to an address signal.

In the embodiment of FIG. 4, when data is written to the semiconductor memory device, the data that is input to the pads of the first and second pad groups 11 and 12 is transmitted to the first and second circuits 13 and 14, respectively. Next, the data passes through the data buses 51–58 and the I/O multiplexers IOMUXes, and then is written to the memory cells of the blocks 101, 102, 201, 202, 301, 302, 401 and 402 in response to an address signal.

Figure 2:
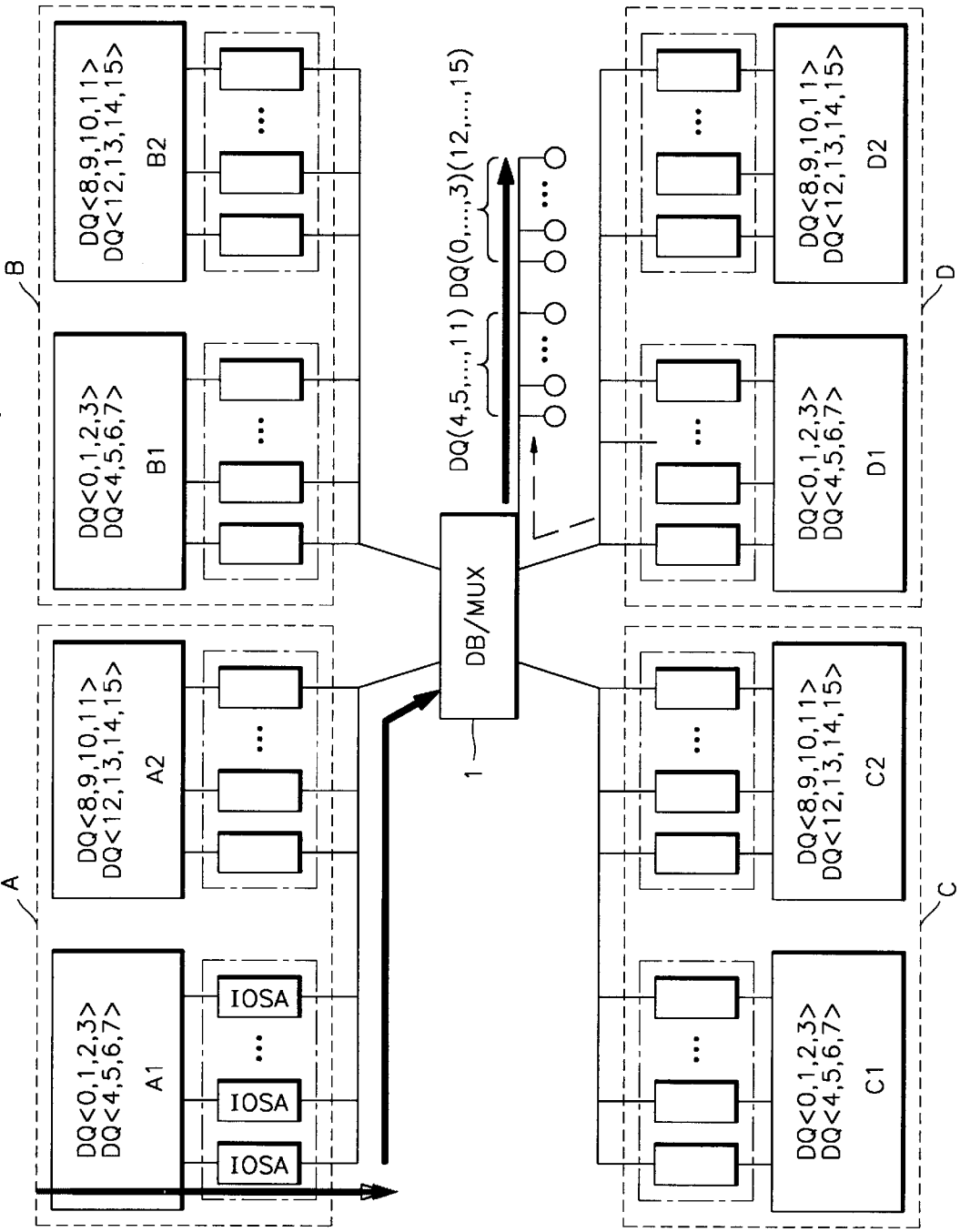
FIG. 2 is a block diagram illustrating a conventional architecture of the SDRAM having the pin configuration shown in FIG. 1.

In the embodiment of FIG. 3, it is to be appreciated that the lengths of the propagation paths between the first circuit 13 and each of the odd-numbered I/O units 61, 63, 65 and 67 of the odd-numbered blocks 101, 201, 301 and 401 are substantially the same. Further, it is apparent that the difference between the length of the longest propagation path and that of the shortest propagation path is significantly reduced as compared with the longest and shortest paths in the conventional semiconductor memory device of FIG. 2. Moreover, the lengths of the propagation paths between the second circuit 14 and each of the even-numbered I/O units 62, 64, 66 and 68 of the even-numbered blocks 102, 202, 302 and 402 are substantially the same. In addition, the difference between the length of the longest propagation path and that of the shortest propagation path is significantly reduced as in the case of the first circuit 13 and the odd-numbered blocks 101, 201, 301 and 401.

Advantageously, a semiconductor memory device comprising an architecture as described herein minimizes the lengths of the I/O data paths as well as any difference in length between the data paths.

Although the invention has been described with reference to particular embodiments, it will be apparent to one of ordinary skill in the art that modifications to the described embodiments may be made without departing from the spirit and scope of the invention. For example, the described embodiments refer to four banks, but the number of banks can be more than 4. Also, in the described embodiments, it is assumed that each bank includes two blocks, but the number of blocks included in each bank can be more than 2.

What is claimed is:

1. A semiconductor memory device, comprising:

a plurality of pad groups each comprising a plurality of data I/O (input/output) pads;

a plurality of banks, wherein each bank comprises a plurality of blocks of memory cells and a plurality of I/O units for sensing and amplifying the state of data output from the memory cells; and a plurality of circuits connected between the plurality of banks and the plurality of pad groups for performing multiplexing, wherein each circuit is operatively connected to at least one corresponding memory block of each bank, and wherein the circuits are disposed on the semiconductor memory device such that each data bus connecting a circuit to the corresponding memory blocks has substantially the same data propagation length.

2. The semiconductor memory device of claim 1, wherein the plurality of pad groups comprise:

a first pad group, located in proximity to the center of the semiconductor device, comprising a first portion of a total number of data I/O pads; and a second pad group comprising a second portion of the total number of data I/O pads.

3. The semiconductor memory device of claim 2, wherein the first and second pad groups comprise an equal number of pads.

4. The semiconductor of claim 2, wherein the plurality of banks comprise:
   a first bank comprising a first block of memory cells, a second block of memory cells, a first I/O unit comprising a plurality of sense amplifiers, and a second I/O unit comprising a plurality of sense amplifiers;
   a second bank comprising a third block of memory cells, a fourth block of memory cells, a third I/O unit comprising a plurality of sense amplifiers and a fourth I/O unit comprising a plurality of sense amplifiers, wherein the second bank is located adjacent to the first bank on the semiconductor memory device;
   a third bank comprising a fifth block of memory cells, a sixth block of memory cells, a fifth I/O unit comprising a plurality of sense amplifiers, and a sixth I/O unit comprising a plurality of sense amplifiers, wherein the third bank is located opposite to the first bank on the semiconductor memory device; and
   a fourth bank comprising a seventh block of memory cells, an eighth block of memory cells, a seventh I/O unit comprising a plurality of sense amplifiers and an eighth I/O unit comprising a plurality of sense amplifiers, wherein the fourth bank is located opposite to the second bank on the semiconductor memory device.

5. The semiconductor memory device of claim 4, wherein the plurality of circuits comprise:
   a first circuit comprising a plurality of multiplexers, wherein the first circuit is operatively connected to the first pad group and operatively connected to the first, third, fifth and seventh I/O units, respectively, via a first data bus, a third data bus, a fifth data bus and a seventh data bus; and
   a second circuit comprising a plurality of multiplexers, wherein the second circuit is operatively connected to the second pad group and operatively connected to the second, fourth, sixth and eighth I/O units, respectively, via a second data bus, a fourth data bus, a sixth data bus and an eighth data bus.

6. The semiconductor memory device of claim 4, wherein each of the I/O units comprise an equal number of sense amplifiers.

7. The semiconductor memory device of claim 5, wherein each of the data buses have substantially the same width.

8. The semiconductor memory device of claim 4, wherein the first, third, fifth and seventh blocks are located at the same position on each of the banks, and the second, fourth, sixth, and eighth blocks are located at the same position on each of the banks.

9. The semiconductor memory device of claim 4, wherein bit weights of data input to and output from the memory cells of the first, third, fifth and seventh blocks are the same as bit weights of data input to and output from the memory cells of the second, fourth, sixth and eighth blocks.

10. A semiconductor memory device, comprising:
    a plurality of pad groups each comprising a plurality of data I/O (input/output) pads;
    a plurality of banks, wherein each bank comprises a plurality of blocks of memory cells and a plurality of I/O units for multiplexing data input to and output from the memory cells; and
    a plurality of circuits connected between the plurality of banks and the plurality of pad groups for sensing and amplifying the state of input and output data, wherein each circuit is operatively connected to at least one corresponding memory block of each bank, and wherein the circuits are disposed on the semiconductor memory device such that each data bus connecting a circuit to the corresponding memory blocks has substantially the same data propagation length.

11. The semiconductor memory device of claim 10, wherein the plurality of pad groups comprise:
    a first pad group, located in proximity to the center of the semiconductor memory device, comprising a first portion of a total number of data I/O pads; and
    a second pad group comprising a second portion of the total number of data I/O pads.

12. The semiconductor memory device of claim 11, wherein the first and second pad groups comprise the same number of pads.

13. The semiconductor memory device of claim 11, wherein the plurality of banks comprise:
    a first bank comprising a first block of memory cells, a second block of memory cells, a first I/O unit comprising a plurality of multiplexers and a second I/O unit comprising a plurality of multiplexers;
    a second bank comprising a third block of memory cells, a fourth block of memory cells, a third I/O unit comprising a plurality of multiplexers and fourth I/O unit comprising a plurality of multiplexers, wherein the second bank is located adjacent to the first bank on the semiconductor memory device;
    a third bank comprising a fifth block of memory cells, a sixth block of memory cells, a fifth I/O unit comprising a plurality of multiplexers and a sixth I/O unit comprising a plurality of multiplexers, wherein the third bank is located opposite to the first bank on the semiconductor memory device; and
    a fourth bank comprising a seventh block of memory cells, an eighth block of memory cells, a seventh I/O unit comprising a plurality of multiplexers and an eighth I/O unit comprising a plurality of multiplexers, wherein the fourth bank is located opposite to the second bank on the semiconductor memory device.

14. The semiconductor memory device of claim 13, wherein the plurality of circuits comprise:
    a first circuit comprising a plurality of sense amplifiers, wherein the first circuit is operatively connected to the first pad group and operatively connected to the first, third, fifth and seventh I/O units, respectively, via a first data bus, a third data bus, a fifth data bus and a seventh data bus; and
    a second circuit comprising a plurality of sense amplifiers, wherein the second circuit is operatively connected to the second pad group and operatively connected to the second, fourth, sixth and eighth I/O units, respectively, via a second data bus, a fourth data bus, a sixth data bus and an eighth data bus.

15. The semiconductor memory device of claim 13, wherein each of the I/O units comprise an equal number of multiplexers.

16. The semiconductor memory device of claim 14, wherein each of the data buses have substantially the same width.

17. The semiconductor memory device of claim 13, wherein the first, third, fifth and seventh blocks are located at the same position on each of the banks, and the second, fourth, sixth and eighth blocks are located at the same position on each of the banks.

18. The semiconductor memory device of claim 13, wherein bit weights of data input to and output from the memory cells of the first, third, fifth and seventh blocks are the same as bit weights of data input to and output from the memory cells of the second, fourth, sixth and eighth blocks.

19. A semiconductor memory device, comprising:

a plurality of banks each comprising a plurality of blocks of memory cells;

a plurality of circuits for processing data input to and data output from the banks; and a plurality of data buses for operatively connecting the circuits to the banks, wherein each circuit is operatively connected to at least one corresponding memory block of each bank, and wherein the circuits are disposed on the semiconductor memory device such that each data bus connecting a circuit to the corresponding memory blocks has substantially the same data propagation length and width.

20. The semiconductor memory device of claim 19, wherein a pin configuration of the semiconductor device is based on a JEDEC (Joint Electron Device Engineering Council) standard.

21. The semiconductor memory device of claim 19, further comprising a plurality of pad groups, each comprising a plurality of I/O (input/output) pads, wherein each pad group is operatively connected to a corresponding one of the plurality of circuits via a data bus, wherein the data buses between the pad groups and circuits are substantially the same length and width.

* * * * *